(12) United States Patent
Kim et al.

(10) Patent No.: US 8,084,940 B2
(45) Date of Patent: Dec. 27, 2011

(54) ORGANIC LIGHT-EMITTING DIODE DISPLAY HAVING NONOVERLAPPING YELLOW AND BLUE EMISSION LAYERS

(75) Inventors: Eun-Ah Kim, Yongin (KR); Mu-Hyun Kim, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 214 days.

(21) Appl. No.: 12/476,618

(22) Filed: Jun. 2, 2009

(65) Prior Publication Data

US 2009/0295283 A1 Dec. 3, 2009

(30) Foreign Application Priority Data

Jun. 3, 2008 (KR) ................................ 2008-52215

(51) Int. Cl.
*H01L 51/52* (2006.01)
*H05B 33/02* (2006.01)

(52) U.S. Cl. ........ 313/507; 313/504; 313/505; 313/498; 313/503

(58) Field of Classification Search ........... 313/498–512
See application file for complete search history.

(56) References Cited

U.S. PATENT DOCUMENTS

| 2004/0051448 A1* | 3/2004 | Matsumoto | 313/506 |
| 2005/0116615 A1* | 6/2005 | Matsumoto et al. | 313/500 |
| 2007/0013282 A1* | 1/2007 | Okutani et al. | 313/111 |

FOREIGN PATENT DOCUMENTS

| JP | 09-134783 | 5/1997 |
| KR | 10-2004-0078562 | 9/2004 |
| KR | 10-2006-0076279 | 7/2006 |

OTHER PUBLICATIONS

Korean Office Action dated Jan. 25, 2010, issued in corresponding Korean Patent Application No. 10-2008-0052215.

* cited by examiner

*Primary Examiner* — Anne Hines
*Assistant Examiner* — Tracie Green
(74) *Attorney, Agent, or Firm* — Christie, Parker & Hale, LLP

(57) ABSTRACT

An OLED display including: a first substrate; an opposing second substrate; an organic light-emitting unit disposed on a side of the first substrate that faces the second substrate; a driving circuit disposed on a side of the second substrate that faces the first substrate and connected to the organic light-emitting unit; and a filter. The organic light-emitting unit includes that is an anode, a cathode, and an organic emission layer disposed therebetween. The organic emission layer includes a blue emission layer a yellow emission layer. The filter is to convert light from the yellow emission layer into red light and green light.

28 Claims, 8 Drawing Sheets

ORGANIC LIGHT-EMITTING DIODE DISPLAY HAVING NONOVERLAPPING YELLOW AND BLUE EMISSION LAYERS

CROSS-REFERENCE TO RELATED APPLICATIONS

This application claims the benefit of Korean Patent Application No. 10-2008-0052215, filed in the Korean Intellectual Property Office on Jun. 3, 2008, the disclosure of which is incorporated herein, by reference.

BACKGROUND OF THE INVENTION

1. Field of the Invention

Aspects of the present invention relate to an organic light-emitting diode (OLED) display having a high resolution.

2. Description of the Related Art

An OLED display includes organic light-emitting elements, each of which is composed of a hole injection electrode, an organic emission layer, and an electron injection electrode. An OLED display emits light when excitons, which are generated by the combination of electrons and holes, fall from an excited state to a ground state.

An OLED display is self-emissive and does not require an additional light source, as is used in a liquid crystal display (LCD), and thus, has a comparatively reduced thickness and weight. Furthermore, an OLED display has low power consumption, a high luminance, and a high response speed.

An OLED display includes sub-pixels that are arranged in a matrix, and each of the sub-pixels includes an organic light-emitting element and a driving circuit. The driving circuit includes a switching transistor, a driving transistor, and a storage capacitor.

The organic light-emitting elements are generally formed by a mask-patterning process, or can be formed by patterning an organic emission layer, through a laser induced thermal imaging method. The organic emission layer can be formed as a striped structure or as matrix structure. A minimum margin is required for patterning sub-pixels, due to limitations of current patterning technology. Accordingly, the resolution of sub-pixels is limited.

SUMMARY OF THE INVENTION

Aspects of the present invention provide an OLED display having a high resolution, while maintaining a minimum margin for patterning of an organic emission layer.

An OLED display, according to an exemplary embodiment of the present invention, includes: a first substrate; an opposing second substrate; an organic light-emitting unit formed between the first and second substrates and having an organic emission layer; a driving circuit formed between the first and second substrates and connected to the organic light-emitting unit; and a filter. The organic emission layer includes a blue emission layer and a yellow emission layer. The filter has a pattern corresponding to the yellow emission layer, which converts yellow light into red light and green light.

According to an exemplary embodiment of the present invention, the filter may include a blue light transmission region corresponding to the blue emission layer, a red light conversion region corresponding to a part of the yellow emission layer, and a green light conversion region corresponding to another part of the yellow emission layer.

According to an exemplary embodiment of the present invention, the blue emission layer and the yellow emission layer each have a first length in a data line direction and a first width in a scan line direction, which is perpendicular to the data line direction. The blue emission layer and the yellow emission layer can have the same area.

According to an exemplary embodiment of the present invention, the blue light transmission region may have the first length and the first width. The red light conversion region and the green light conversion region may each have the first length and a second width that is half of the first width.

According to an exemplary embodiment of the present invention, a unit pixel may include a blue sub-pixel, a red sub-pixel, and a green sub-pixel. The blue sub-pixel may include the blue emission layer and a corresponding blue light transmission region. The red sub-pixel may include a portion of a yellow emission layer and a corresponding red light conversion region. The green sub-pixel may include a portion of the yellow emission layer and a corresponding green light conversion region.

According to an exemplary embodiment of the present invention, the blue sub-pixel may have the first length and the first width. The red sub-pixel and the green sub-pixel may have the first length and the second width.

According to an exemplary embodiment of the present invention, the yellow emission layer may have a first length in a data line direction and a first width in a scan line direction, which is perpendicular to the data line direction. The blue emission layer may have the first length and a second width corresponding to half the first width. The area of the blue emission layer may correspond to half of the area of the yellow emission layer.

According to an exemplary embodiment of the present invention, the blue light transmission region, the red light conversion region, and the green light conversion region may have the first length and the second width.

According to an exemplary embodiment of the present invention, the blue sub-pixel, the red sub-pixel, and the green sub-pixel may have the first length and the second width.

According to an exemplary embodiment of the present invention, the blue emission layer may have a first length in a data line direction, the yellow emission layer may have a first width in a scan line direction, which is perpendicular to the data line direction. The blue emission layer may have a second width corresponding to half the first width, and the yellow emission layer may have a second length that is shorter than the first length.

According to an exemplary embodiment of the present invention, the blue light transmission layer may have the first length and the second width. The red light conversion region and the green light conversion region may have the second length and the first width.

According to an exemplary embodiment of the present invention, the blue sub-pixel may have the first length and the second width. The red sub-pixel and the green sub-pixel may each have the second length and the second width.

According to an exemplary embodiment of the present invention, the filter may further include a yellow light transmission region corresponding to a portion of the yellow emission layer.

According to an exemplary embodiment of the present invention, the blue light transmission region may have the first length and the first width. The red light conversion region may have the first length and the second width. The green light conversion region and the yellow light transmission region may have the first length and a third width that is half of the second width.

According to an exemplary embodiment of the present invention, a unit pixel may include two red light conversion regions. The yellow emission layer may have a first length in a data line direction and a first width in a scan line direction, which is perpendicular to the data line direction. The blue emission layer may have the first length and a second width corresponding to half the first width, such that the area of the blue emission layer corresponds to half the area of the yellow emission layer. The blue light transmission region may have the first length and the second width, the two red light conversion regions may be disposed in a diagonal direction and have a third length corresponding to half the first length and the second width. The red light conversion regions and the yellow light transmission region may be disposed in a diagonal direction that is perpendicular to the direction in which the red light conversion regions are disposed. The red light conversion regions and the yellow light transmission region may each have the third length and the second width.

According to an exemplary embodiment of the present invention, a unit pixel may include a blue sub-pixel, two red sub-pixels, a green sub-pixel, and a yellow sub-pixel. The blue sub-pixel may include the blue emission layer and the corresponding blue light transmission region. The two red sub-pixels may include the yellow emission layer and the red light conversion regions corresponding to the yellow emission layer. The green sub-pixel may include the yellow emission layer and the corresponding green light conversion region. The yellow sub-pixel may include the yellow emission layer and the corresponding yellow light transmission region.

The blue sub-pixel may have the first length and the second width. The two red sub-pixels, the green sub-pixel, and the yellow sub-pixel may each have the third length and the second width.

According to an exemplary embodiment of the present invention, the filter may further include a yellow light transmission region corresponding to a portion of the yellow emission layer. The blue emission layer may include a first region having a first length in a data line direction and a first width in a scan line direction, which is perpendicular to the data line direction, and a second region having a fourth length that is shorter than the first length. The yellow emission layer may have a fifth length corresponding to a difference between the first length and the fourth length.

According to an exemplary embodiment of the present invention, the blue light transmission region may include a first region having the first length and the first width, and a second region having the fourth length and the first width. The red light conversion region, the green light conversion region, and the yellow light conversion region may have the fifth length and a fourth width corresponding to a third of the first width.

According to an exemplary embodiment of the present invention, the blue sub-pixel may include a first region having the first length and the first width, and a second region having the fourth length and the first width. The red sub-pixel, the green sub-pixel, and the yellow sub-pixel may each have the fifth length and the fourth width.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION OF THE EXEMPLARY EMBODIMENTS

Figure 1:
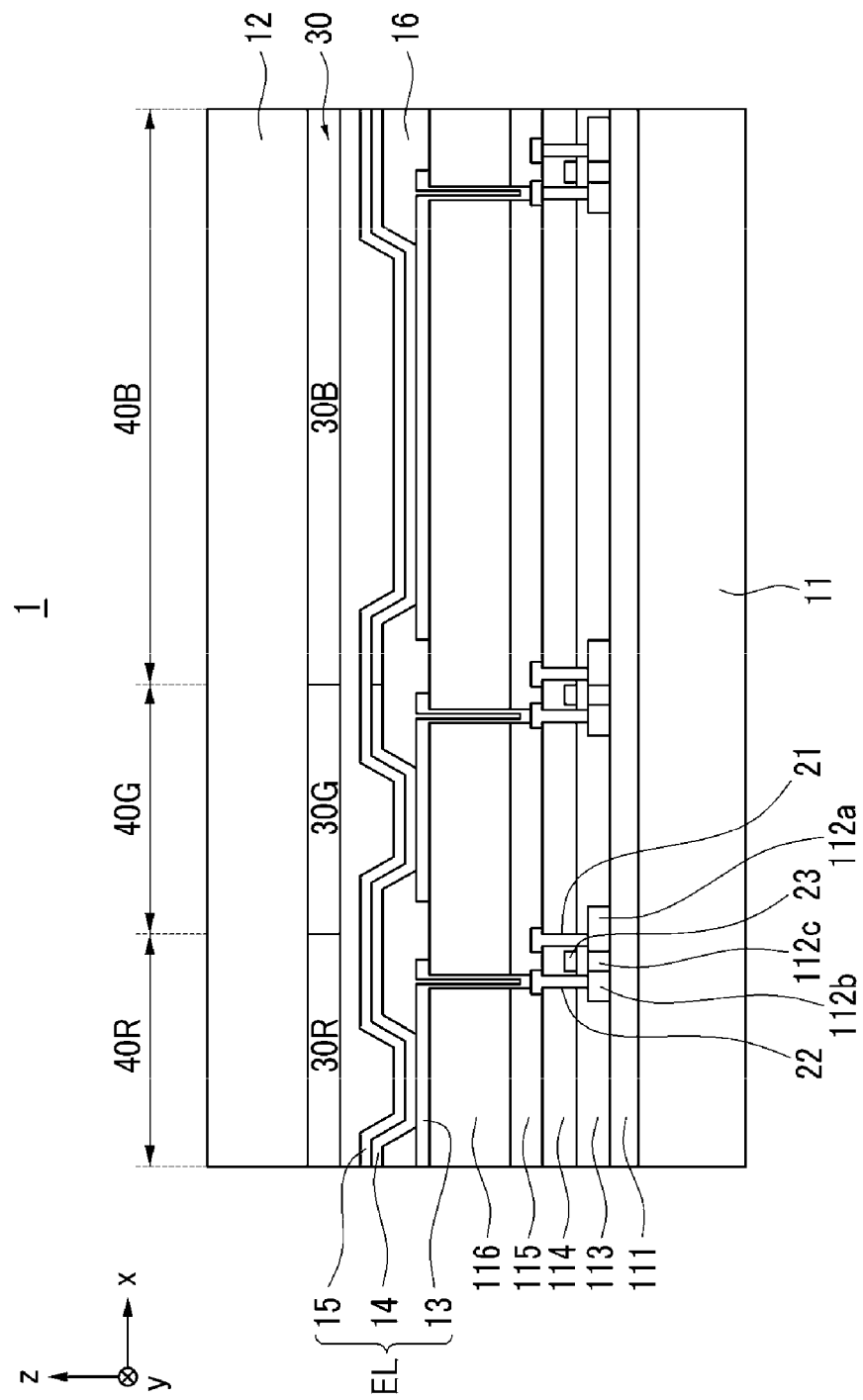
FIG. 1 is a cross-sectional view of an OLED display, according to a first exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Figure 2:
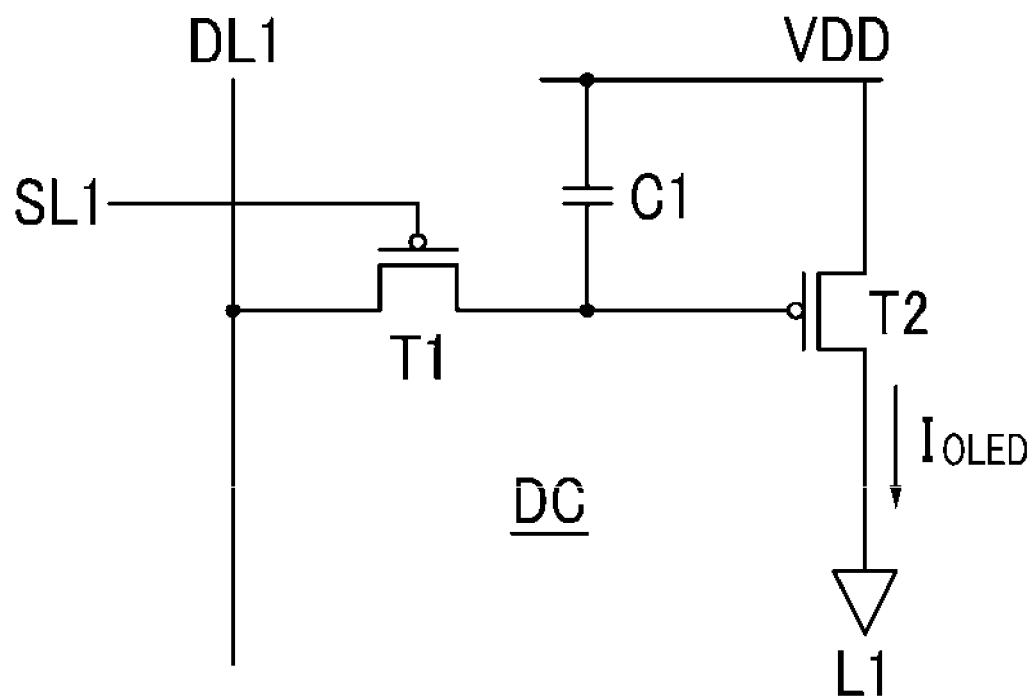
FIG. 2 is a schematic diagram of a sub-pixel circuit structure illustrated in FIG. 1.

FIG. 1 is a cross-sectional view of an OLED display 1, according to a first exemplary embodiment of the present invention, and FIG. 2 is a schematic diagram of a sub-pixel circuit structure illustrated in FIG. 1. Referring to FIGS. 1 and 2, the OLED display 1 includes a first substrate 11 (rear substrate), an opposing second substrate 12 (front substrate), and an organic light-emitting unit EL, a driving circuit DC, and a filter 30.

The organic light-emitting unit EL is formed on a side of the rear substrate 11 that faces the front substrate 12, and includes an anode 13, an organic emission layer 14, and a cathode 15. The organic emission layer 14 is disposed between the anode 13 and the cathode 15, and emits light.

The driving circuit DC is formed on a side of the rear substrate 11 that faces the front substrate 12, and includes a switching transistor T1, a driving transistor T2, and a storage capacitor C1. The switching transistor T1 is connected to a scan line SL1 and a data line DL1, and transmits a data voltage input to the data line DL1, to the driving transistor T2, according to a switching voltage input to the scan line SL1.

The storage capacitor C1 is connected to the switching transistor T1 and a power line VDD. The storage capacitor C1 stores a voltage corresponding to a difference between a voltage transmitted from the switching transistor T1 and a voltage supplied to the power line VDD.

The driving transistor T2 is connected to a power line VDD and the storage capacitor C1. The driving transistor T2 provides an output current $I_{OLED}$, in proportion to the square of a difference between the voltage stored in the storage capacitor C1 and a threshold voltage thereof, to the organic light-emitting unit EL, such that the organic light-emitting unit EL emits light according to the output current $I_{OLED}$.

The driving transistor T2 includes a source electrode 21, a drain electrode 22, and a gate electrode 23. The anode 13 of the organic light-emitting unit EL can be connected to the drain electrode 22 of the driving transistor T1. The sub-pixel structure is not limited to the above-described example.

The front substrate 12 is bonded to the rear substrate 11 using a sealant, so as to maintain a predetermined distance from the rear substrate 11. The sealant seals and protects driving circuits DC and organic light-emitting units EL formed on the rear substrate 11.

A buffer layer 111 is formed on the rear substrate 11. The buffer layer 111 prevents impurities from infiltrating into the driving transistor T2 of the driving circuit DC, during a manufacturing process. For example, the buffer layer 111 can be formed of layers of silicon oxide and silicon nitride.

A source region 112a, a drain region 112b, and a channel region 112c, which are connected to the driving transistor T2, are formed on the buffer layer 111. A gate insulating layer 113 is formed on the source region 112a, the drain region 112b, the channel region 112c, and the buffer layer 111. The gate electrode 23 is formed on the gate insulating layer 113. An interlayer insulating layer 114 is formed on the gate insulating layer 113 and the gate electrode 23.

The source electrode 21 and the drain electrode 22 extend through the interlayer insulating layer 114, and are respectively connected to the source region 112a and the drain region 112b. An inorganic insulation layer 115 and a planarization layer 116 are sequentially formed on the source electrode 21, the drain electrode 22, and the interlayer insulating layer 114. The inorganic insulation layer 115 protects the layers disposed there beneath from external moisture, impurities, or an etching process, and can be exemplarily formed of one or more layers of silicon nitride and/or silicon oxide. The drain electrode 22 penetrates the inorganic insulation layer 115 and the planarization layer 116, and is connected to the anode 13 of the organic light-emitting unit EL.

A pixel-defining layer 16 is patterned on the planarization layer 116, to define spaces for forming sub-pixels 40B, 40R, and 40G of the organic emission layer 14. The anode 13 and the cathode 15, having the organic emission layer 14 disposed therebetween, are arranged in the sub-pixels 40B, 40R, and 40G, that is, they are arranged in the defined spaces.

The anode 13 injects holes into the organic emission layer 14, and the cathode 15 injects electrons into the organic emission layer 14. The holes and the electrons are combined in the organic emission layer 14 to generate excitons, and light is emitted when the excitons fall from an excited state to a ground state. Exemplary embodiments of the present invention use the filter 30 that is included in the sub-pixels 40B, 40R, and 40G, in order to achieve a high resolution, while maintaining a minimum margin between neighboring sub-pixels 40B, 40R, and 40G.

Figure 3:
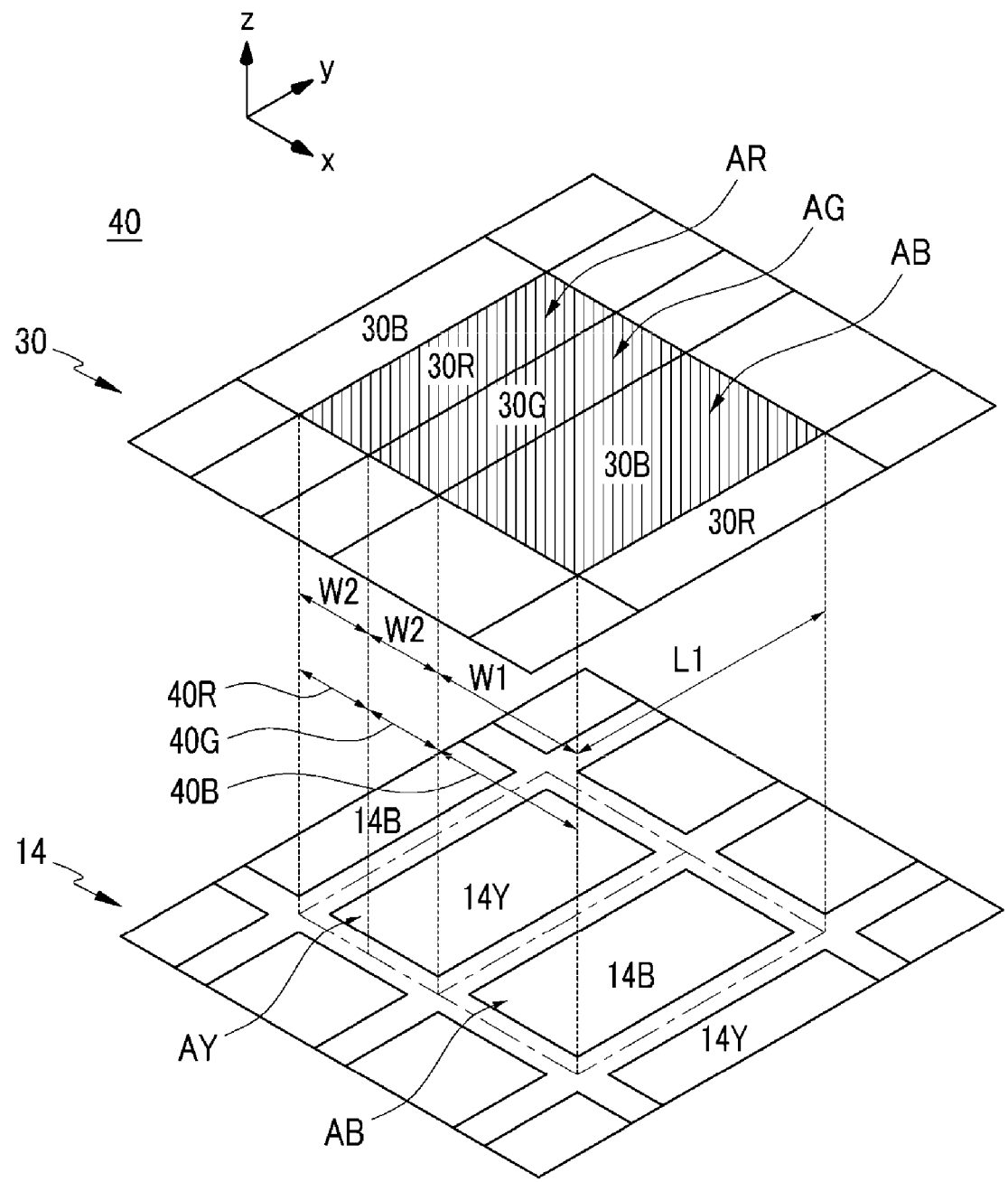
FIG. 3 is a perspective view showing the relationship between an organic emission layer and a filter illustrated in FIG. 1.

Referring to FIGS. 1 and 3, in a unit pixel 40 of the OLED display 1, the organic emission layer 14 is formed as two regions, and the filter 30 is partitioned into three regions, to form the three sub-pixels 40B, 40R, and 40G. For example, the organic emission layer 14 can include a blue emission layer 14B that emits blue light, and a yellow emission layer 14Y that emits yellow light. That is, the organic emission layer 14 generates blue light and yellow light.

For example, the yellow emission layer 14Y can be include a lawrencium polyphenylene vinylene (LrPPV) derivative, such as Lr(piq), which is a red phosphor dopant, or a PPV polymer. The Lr(piq) has an efficiency of from 50 to 60 cd/A.

In general, a red emission layer material has an efficiency of from 10 to 20 cd/A, a green emission layer material has an efficiency of from 30 to 40 cd/A, and a blue emission layer material has an efficiency of from 3 to 8 cd/A.

The filter 30 has a pattern corresponding to the yellow emission layer 14Y and the blue emission layer 14B. The filter 30 transmits blue light and converts yellow light into red light and green light. For example, the filter 30 includes a blue light transmission region 30B, a red light conversion region 30R, and a green light conversion region 30G.

In the OLED display 1, the area of the blue light transmission region 30B, which has a relatively lower efficiency, is increased, and the areas of the red light conversion region 30R and the green light conversion region 30G, which have relatively higher efficiencies, are decreased, to improve the overall efficiency of the OLED display 1.

The blue light transmission region 30B faces the blue emission layer 14B and transmits the blue light from the blue emission layer 14B. The red light conversion region 30R faces part of the yellow emission layer 14Y, and converts a portion of the yellow light from the yellow emission layer 14Y, into red light. The green light conversion region 30G faces another part of the yellow emission layer 14Y, and converts a portion of the yellow light from the yellow emission layer 14Y, into green light.

The driving circuit DC is independently formed for each of the blue light transmission region 30B, the red light conversion region 30R, and the green light conversion region 30G, which are partitioned by the filter 30. Referring to FIG. 1, the organic emission layer 14 is partitioned into two regions, and three driving circuits DC respectively correspond to the blue light transmission region 30B, the red light conversion region 30R, and the green light conversion region 30G, are formed.

In the organic emission layer 14, the blue emission layer 14B and the yellow emission layer 14Y have a first length L1 in a data line direction (y-axis direction), and a first width W1 in a scan line direction (x-axis direction), which is perpendicular to the data line direction. That is, the area AB of the blue emission layer 14B equals the area AY of the yellow emission layer 14Y (AB=AY=L1*W1). For convenience, the gap between neighboring sub-pixels 40B, 40R, and 40G is ignored in the area calculations.

In the filter 30, the blue light transmission region 30B has the first length L1 and the first width W1. The red light conversion region 30R and the green light conversion region 30G have the first length L1 and a second width W2 that is half of the first width W1 (W2=W1/2). That is, the area AB of the blue light transmission region 30B corresponds to the sum of the area AR of the red light conversion region 30R and the area AG of the green light conversion region 30G (AB=AR+AG). The area AR of the red light conversion region 30R equals the area AG of the green light conversion region 30G (AR=AG=L1*W2).

In the first exemplary embodiment, a unit pixel 40 includes the blue sub-pixel 40B, the red sub-pixel 40R, and the green sub-pixel 40G. The blue sub-pixel 40B includes the blue emission layer 14B and the blue light transmission region 30B. The red sub-pixel 40R includes a portion of the yellow emission layer 14Y and the red light conversion region 30R. The green sub-pixel 40G includes a portion of the yellow emission layer 14Y and the green light conversion region 30G.

The blue sub-pixel 40B has the first length L1, the first width W1, and the area L1*W1. The red sub-pixel 40R and the green sub-pixel 40G each has the first length L1, the second width W2, and the area L1*W2.

As described above, the area of the blue sub-pixel 40B is larger than the area of the red sub-pixel 40R or the green sub-pixel 40G. Thus, the generation of blue light is enhanced, to increase the color temperature thereof.

The first exemplary embodiment of the present invention can achieve a higher resolution, as compared to the related art, since the number of organic emission layers 14 in the unit pixel 40 is reduced from three to two. This also reduces the area of the margins between the neighboring sub-pixels 40B, 40R, and 40G.

Second through sixth exemplary embodiments of the present invention will now be explained. For convenience, explanations of the elements similar to the elements of the first exemplary embodiment are omitted.

Figure 4:
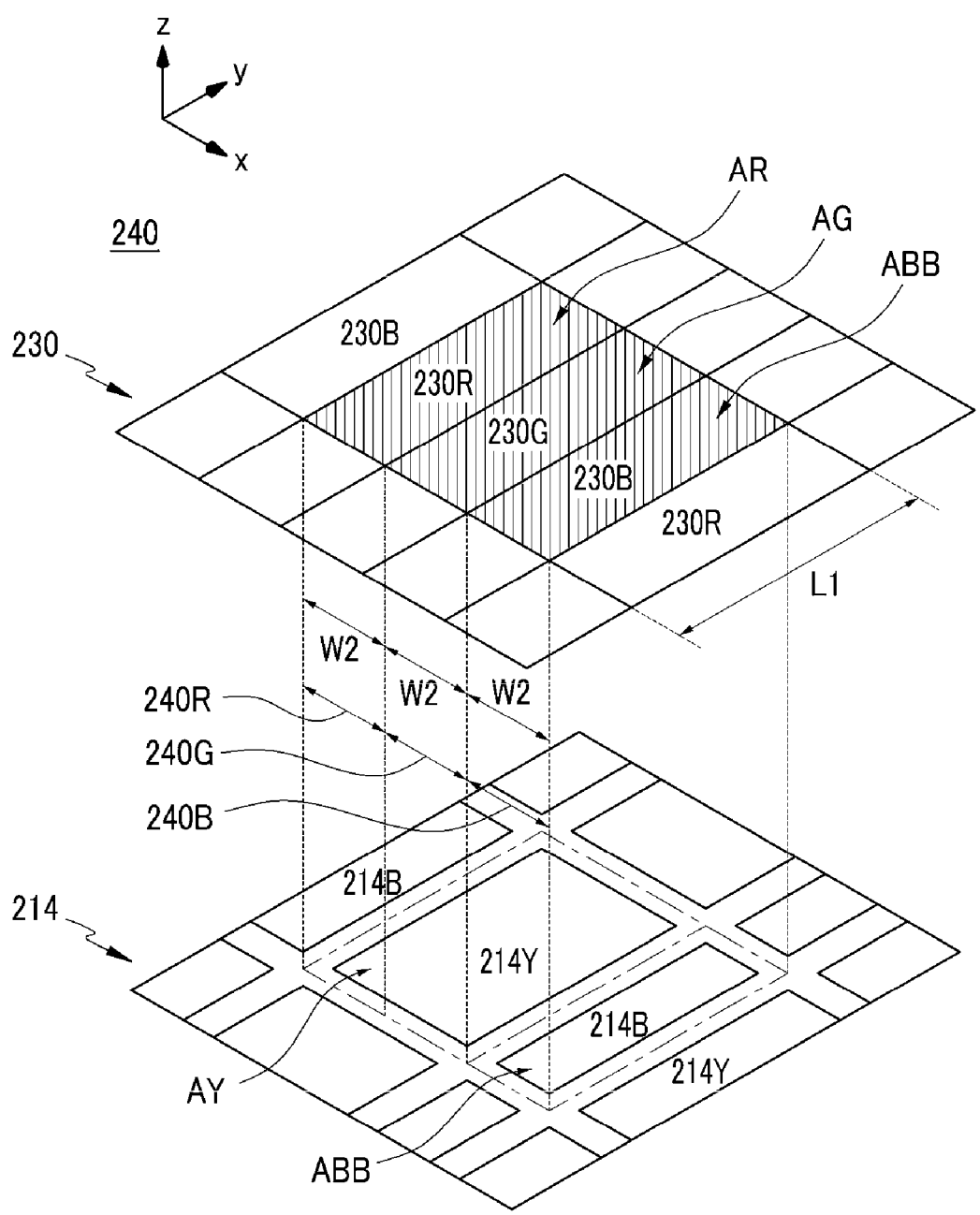
FIG. 4 is a perspective view showing the relationship between an organic emission layer and a filter in an OLED display, according to a second exemplary embodiment of the present invention.

FIG. 4 is a perspective view showing the relationship between an organic emission unit 214 and a filter 230, of a unit pixel 240 of an OLED display, according to the second exemplary embodiment of the present invention. Referring to FIG. 4, the organic emission layer 214 includes a blue emission layer 214B and a yellow emission layer 214Y. The filter 230 includes a blue light transmission region 230B, a green light conversion region 230G, and a red light conversion region 230R.

The blue emission layer 214B and the blue light transmission region 230 have areas that are about half of the areas of the blue emission layer 14B and the blue light transmission region 30B, respectively, of the first exemplary embodiment. The blue emission layer 214B has a first length L1 in a data line direction (y-axis direction) and a second width W2 in a scan line direction (x-axis direction).

The yellow emission layer 214Y that has the first length L1 in the data line direction (y-axis direction) and a first width W1 in the scan line direction (x-axis direction). That is, the area ABB of the blue emission layer 214B corresponds to half the area AY of the yellow emission layer 214Y (ABB=AY/2=L1*W2).

The blue light transmission region 230B, the red light conversion region 230R, and the green light conversion region 230G each has the first length L1 and the second width W2. That is, the area ABB of the blue light transmission region 230B, the area AR of the red light conversion region 230R, and the area AG of the green light conversion region 230G are the same.

In the unit pixel 240, the blue emission layer 214B and the blue light transmission region 230B can be referred to as a blue sub-pixel 240B. A portion of the yellow emission layer 214Y and the red light conversion region 230R can be referred to as a red sub-pixel 240R. A portion of the yellow emission layer 214Y and the green light conversion region 230G can be referred to as a green sub-pixel 240G. The blue sub-pixel 240B, the red sub-pixel 240R, and the green sub-pixel 240G have the first length L1, the second width W2, and the area L1*W2.

The number of organic emission layers 214 in each pixel unit 240 is reduced from three, as used in convention pixel units, to two. The total area of the margins between the sub-pixels is also comparatively reduced. In addition, the area of the blue sub-pixel 240B is reduced by half, as compared to the area of the blue sub-pixels 40B of the first exemplary embodiment. Thus, the second exemplary embodiment can achieve a higher resolution, as compared to the first exemplary embodiment.

Figure 5:
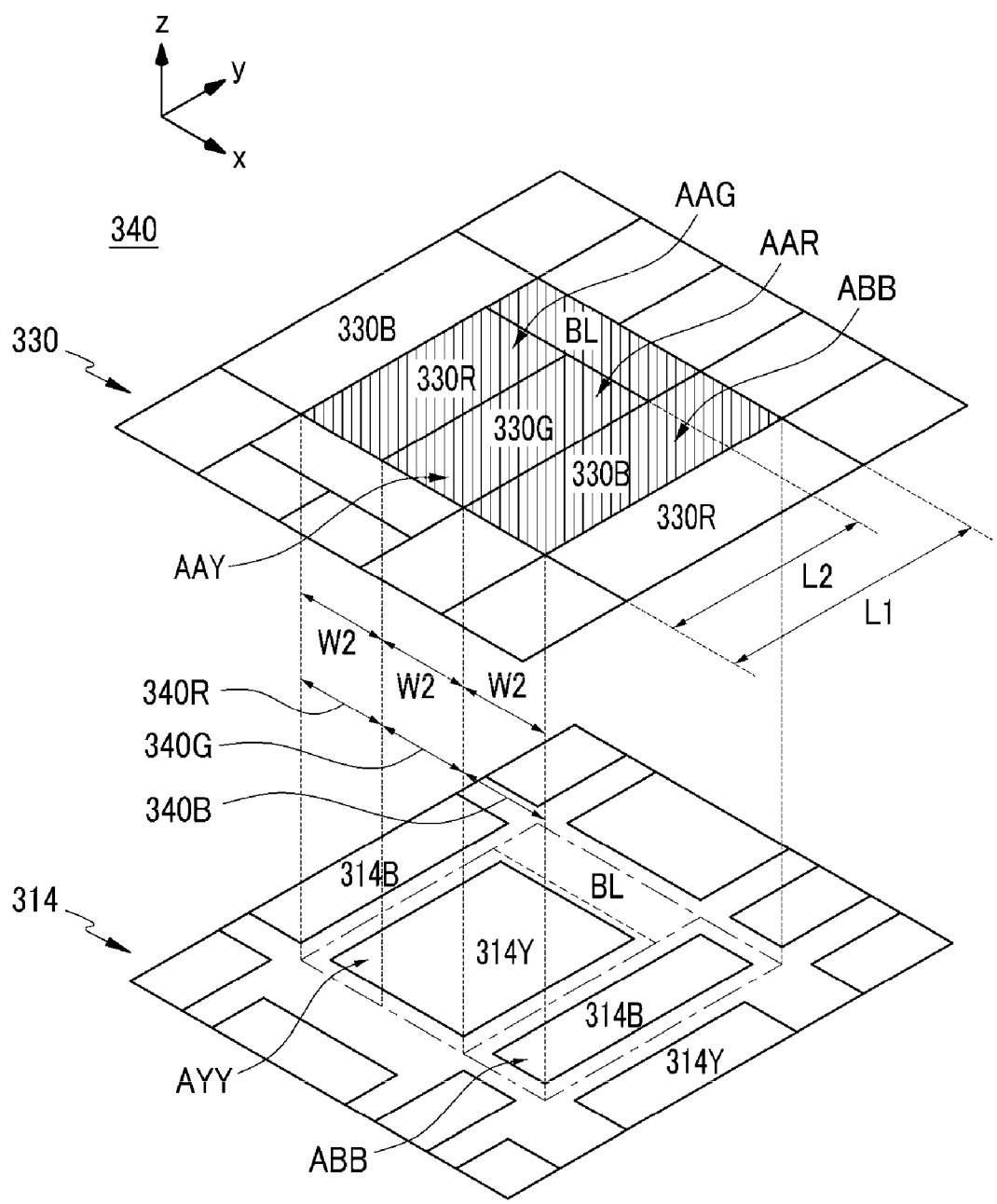
FIG. 5 is a perspective view showing the relationship between an organic emission layer and a filter in an OLED display, according to a third exemplary embodiment of the present invention.

FIG. 5 is a perspective view showing the corresponding relationship between an organic emission unit 314 and a filter 330, of a unit pixel 340 of an OLED display, according to the third exemplary embodiment of the present invention. Referring to FIG. 5, the organic emission unit 314 includes a blue emission layer 314B and a yellow emission layer 214Y. The filter 330 includes a blue light transmission region 330B, a green light conversion region 330G, and a red light conversion region 330R.

The yellow emission layer 314Y and the red light conversion region 330R are smaller than the yellow emission layer 214Y and the red light conversion region 230R of the second exemplary embodiment. The yellow emission layer 314Y and a green light conversion region 330G are also smaller than the yellow emission layer 214Y and the green light conversion region 230G of the second exemplary embodiment.

The blue emission layer 314B has a first length L1 in a data line direction (y-axis direction) and a second width W2 in a scan line direction (x-axis direction). The yellow emission layer 314Y has a second length L2 that is shorter than the first length L1, in the data line direction (y-axis direction), and a first width W1 in the scan line direction (x-axis direction). That is, the area ABB of the blue emission layer 314B is different from the area AYY of the yellow emission layer 314Y (ABB=L1*W2 and AYY=L2*W1).

In the third exemplary embodiment, the unit pixel 340 includes a blue sub-pixel 340B, a red sub-pixel 340R, and a green sub-pixel 340G. The blue sub-pixel 340B includes the blue emission layer 314B and the blue light transmission region 330B. The red sub-pixel 340R includes a portion of the yellow emission layer 314Y and the red light conversion region 330R. The green sub-pixel 340G includes a portion of the yellow emission layer 314Y and the green light conversion region 330G.

The blue sub-pixel 340B has the first length L1, the second width W2, and the area L1*W2. The red sub-pixel 340R and green sub-pixel 340G have the second length L2, the second width W2, and the area L2*W2.

The red sub-pixel 340R and the green sub-pixel 340G have an area (L1−L2)*W2 that is smaller than the areas of the red sub-pixel 240R and the green sub-pixel 240G, of the second exemplary embodiment. The third exemplary embodiment includes a blank pixel BL, in the unit pixel 340.

Figure 6:
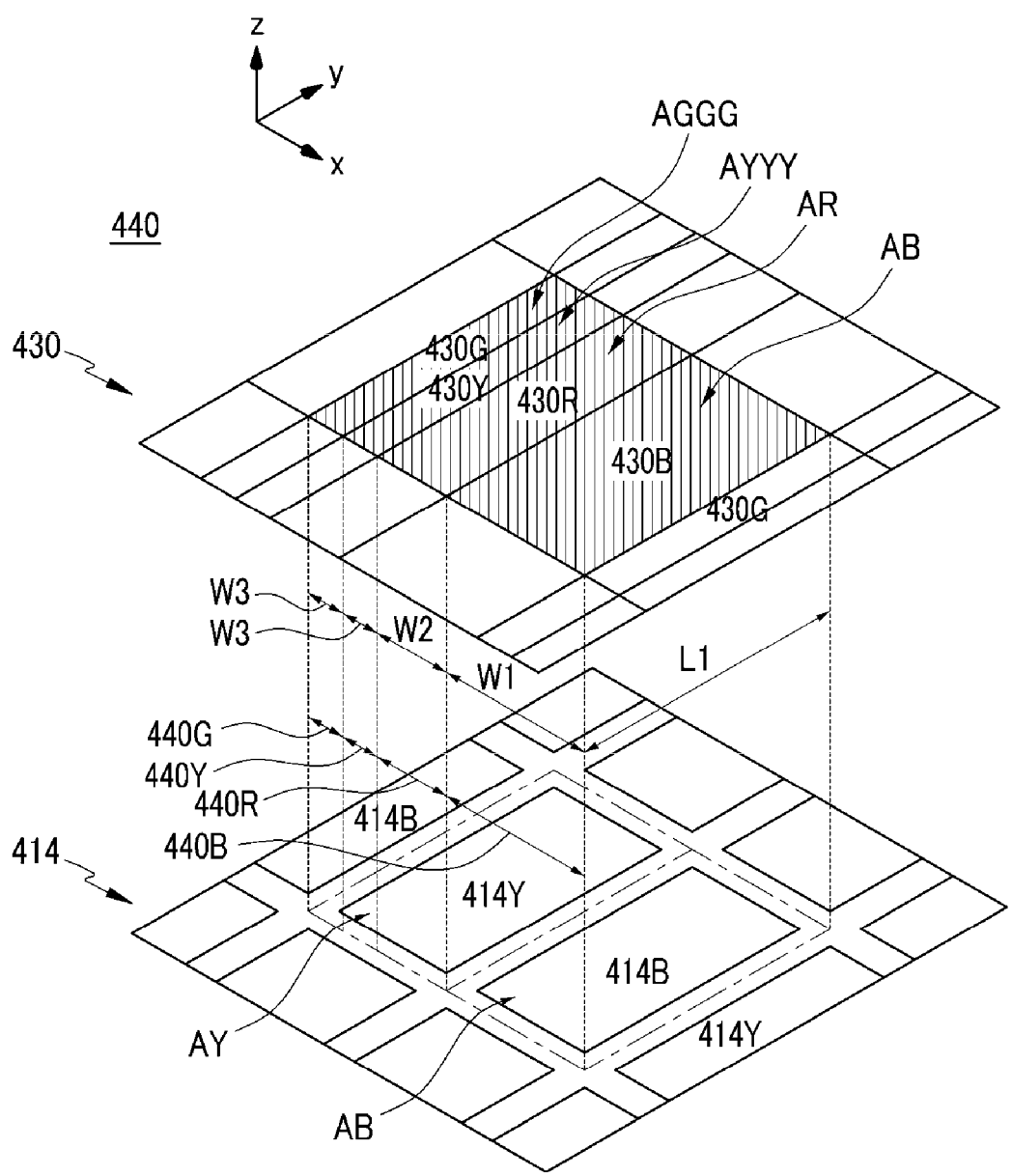
FIG. 6 is a perspective view showing the relationship between an organic emission layer and a filter in an OLED display, according to a fourth exemplary embodiment of the present invention.

FIG. 6 is a perspective view showing the relationship between an organic emission unit 414 and a filter 430, of a unit pixel 440 of an OLED display, according to the fourth exemplary embodiment of the present invention. Referring to FIG. 6, the organic emission unit 414 includes a blue emission layer 414B and a yellow emission layer 414Y. The filter 430 includes a blue light transmission region 430B, a yellow light transmission region 430Y, a green light conversion region 430G, and a red light conversion region 430R.

The yellow light transmission region 430Y corresponds to a portion of the yellow emission layer 414Y and transmits yellow light. The blue emission layer 414B and the yellow emission layer 414Y have a first length L1 in a data line direction (y-axis direction) and a first width W1 in a scan line direction (x-axis direction). That is, the area AB of the blue emission layer 414B equals the area AY of the yellow emission layer 414Y (AB=AY=L1*W1).

The blue light transmission region 430B has the first length L1 and the first width W1. The red light conversion region 430R has the first length L1 and the second width W2. The green light conversion region 430G and the yellow light transmission region 430Y have the first length L1 and a third width W3 (W3=W2/2), corresponding to half the second width W2.

That is, the area AB of the blue light transmission region 430B corresponds to the sum of the area AR of the red light conversion region 430R, the area AGGG of the green light conversion region 430G, and the area AYYY of the yellow light transmission region 430Y (AB=AR+AGGG+AYYY).

The area AR of the red light conversion region 430R corresponds to the sum of the area AGGG of the green light conversion region 430G and the area AYYY of the yellow light transmission region 430Y (AR=AGGG+AYYY). The area AGGG of the green light conversion region 430G corresponds to the area AYYY of the yellow light transmission region 430Y (AGGG=AYYY).

The unit pixel 440 includes a blue sub-pixel 440B, a red sub-pixel 440R, a green sub-pixel 440G, and a yellow sub-pixel 440Y. The blue sub-pixel 440B includes the blue emission layer 414B and the blue light transmission region 430B. The red sub-pixel 440R includes a portion of the yellow emission layer 414Y and the red light conversion region 430R. The green sub-pixel 440G includes a portion of the yellow emission layer 414Y and the green light conversion region 430G. The yellow sub-pixel 440Y includes the portion of yellow emission layer 414Y and the yellow light transmission region 430Y. As the unit pixel 440 further includes the yellow sub-pixel 440Y, the efficiency thereof is improved, as compared to the related art.

The blue sub-pixel 440B has the first length L1, the first width W1, and the area L1*W1. The red sub-pixel 440R has the first length L1, the second width W2, and the area L1*W2. The green sub-pixel 440G and the yellow sub-pixel 440Y have the first length L1, the third width W3, and the area L1*W3.

Figure 7:
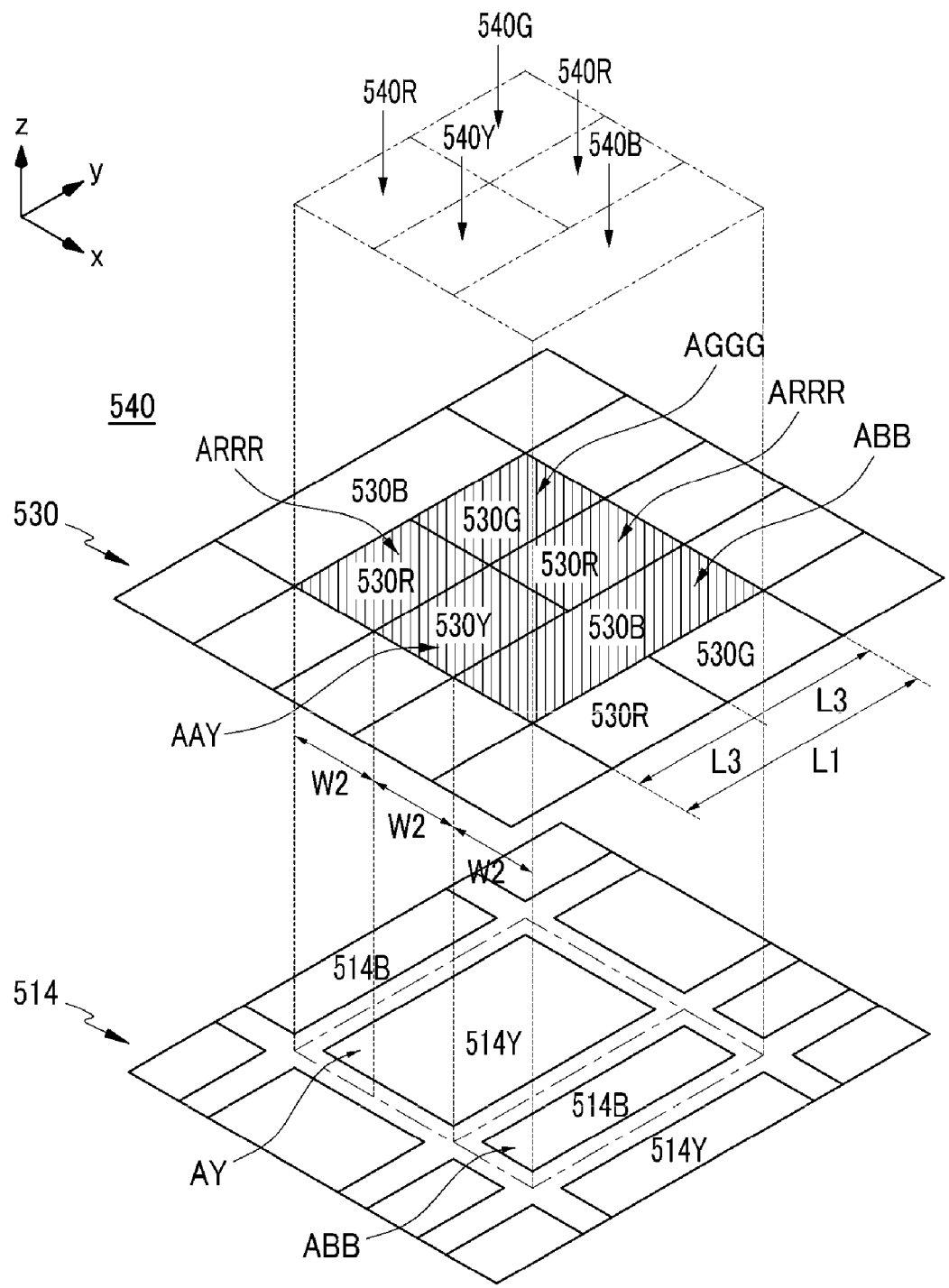
FIG. 7 is a perspective view showing the relationship between an organic emission layer and a filter in an OLED display, according to a fifth exemplary embodiment of the present invention.

FIG. 7 is a perspective view showing the relationship between an organic emission unit 514 and a filter 530 of a unit pixel 540 of an OLED display, according to the fifth exemplary embodiment of the present invention. Referring to FIG. 7, the organic emission unit 514 includes a blue emission layer 514B and a yellow emission layer 514Y. The filter 530 includes a blue light transmission region 530B, a yellow light transmission region 530Y, a green light conversion region 530G, and two red light conversion regions 530R.

The yellow light transmission region 530Y corresponds to a portion of the yellow emission layer 514Y and transmits yellow light. The blue emission layer 514B has a first length L1 in a data line direction (y-axis direction) and a second width W2 in a scan line direction (x-axis direction). The yellow emission layer 514Y has the first length L1 in the data line direction (y-axis direction) and a first width W1 in the scan line direction (x-axis direction). That is, the area ABB of the blue emission layer 214B corresponds to half the area AY of the yellow emission layer 214Y (ABB=AY/2=L1*W2).

The blue light transmission region 530B has the first length L1 and the second width W2. The two red light conversion regions 530R are disposed diagonally and each has a third length L3 (L3=L1/2) corresponding to half the first length L1 and the second width W2. The green light conversion region 530G and the yellow light transmission region 530Y are disposed diagonally to the two red light conversion regions 530R and each has the third length L3 and the second width W2. That is, the area ABB of the blue light transmission region 530B corresponds to the sum of the areas ARRR of the two red light conversion regions 530R, and the sum of the area AGGG of the green light conversion region 530G and the area AAY of the yellow light transmission region 530Y (ABB=ARRR+ARRR=AGGG+AAY).

The unit pixel 540 includes a blue sub-pixel 540B, two red sub-pixels 540R, a green sub-pixel 540G, and a yellow sub-pixel 540Y. The blue sub-pixel 540B includes the blue emission layer 514B and the blue light transmission region 530B. The two red sub-pixels 540R include respective portions of the yellow emission layer 514Y and the corresponding red light conversion regions 530R. The green sub-pixel 540G includes a portion of the yellow emission layer 514Y and the green light conversion region 530G. The yellow sub-pixel 540Y includes a portion of the yellow emission layer 514Y and the yellow light transmission region 530Y.

The blue sub-pixel 540B has the first length L1, the second width W2, and the area L1*W2. The two red sub-pixels 540R, the green sub-pixel 540G, and the yellow sub-pixel 540Y each has the third length L3, the second width W2, and the area L3*W2. The unit pixel 540 includes the yellow sub-pixel 540Y and thus, efficiency can be improved, as compared to the related art.

Figure 8:
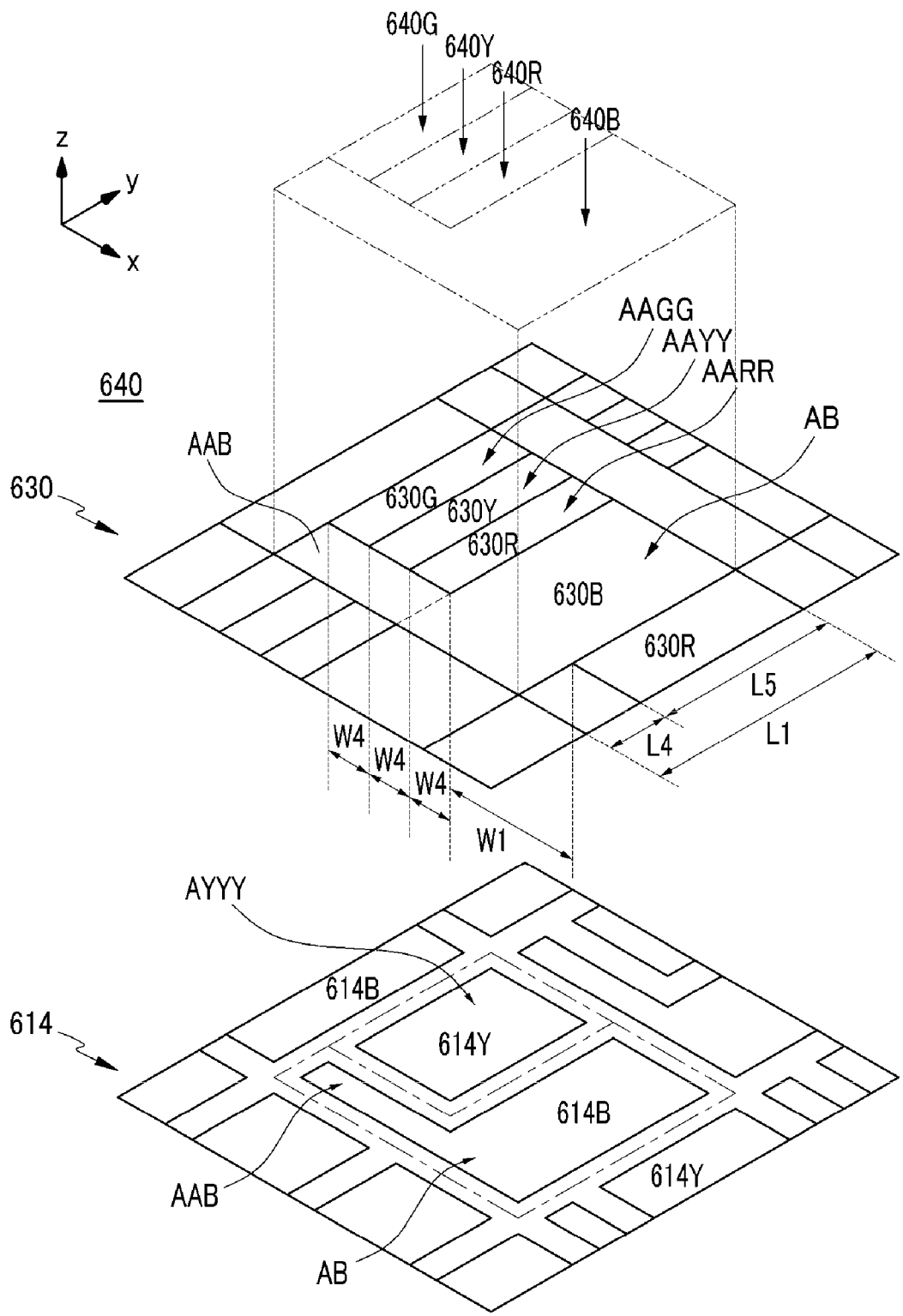
FIG. 8 is a perspective view showing the relationship between an organic emission layer and a filter in an OLED display, according to a sixth exemplary embodiment of the present invention.

FIG. 8 is a perspective view showing the relationship between an organic emission unit 614 and a filter 630, of a unit pixel 640 of an OLED display, according to the sixth exemplary embodiment of the present invention. Referring to FIG. 8, organic emission unit 614 includes a blue emission layer 614B and a yellow emission layer 614Y. The filter 630 includes a blue light transmission region 630B, a yellow light transmission region 630Y, a green light conversion region 630G, and a red light conversion region 630R.

The blue light transmission region 630B has an area AB+AAB that is larger than that of the blue light transmission region 430b, according to the fourth exemplary embodiment of the present invention. The red light conversion region 630R, the yellow light transmission region 630Y, and the green light conversion region 630G each have the same area.

The blue emission layer 614B includes a region having a first length L1 in a data line direction (y-axis direction) and a first width W1 in a scan line direction (x-axis direction), and a region having a fourth length L4 that is shorter than the first length L1 and the first width W1 in the scan line direction. The yellow emission layer 614Y has a fifth length L5 corresponding to a difference between the first length L1 in the data line direction (y-axis direction) and the fourth length L4. The yellow emission layer 614Y has the first width W1 in the scan line direction (x-axis direction). That is, the area AB+AAB of the blue emission layer 614B is larger than the area AYYY of the yellow emission layer 614Y (AB+AAB>AYYY).

The blue light transmission region 630B has a portion having the first length L1 and the first width W1, and a portion having the fourth length L4 and the first width W1. The red light conversion region 630R, the green light conversion region 630G, and the yellow light transmission region 630Y each has the fifth length L5 and a fourth width W4, which corresponds to a third of the first width W1. That is, the area AB+AAB of the blue light transmission region 630B corresponds to the sum of the area AARR of the red light conversion region 630R, the area AAGG of the green light conversion region 630G, and the area AAYY of the yellow light transmission region 630Y (AB+AAB=AARR+AAGG+AAYY). Furthermore, the area AARR of the red light conversion region 630R, the area AAGG of the green light conversion region 630G, and the area AAYY of the yellow light transmission region 630Y are identical (AARR=AAGG=AAYY).

The unit pixel 640 includes a blue sub-pixel 640B, a red sub-pixel 640R, a green sub-pixel 640G, and a yellow sub-pixel 640Y. The blue sub-pixel 640B includes the blue emission layer 614B and the blue light transmission region 630B. The red sub-pixel 640R includes a portion of the yellow emission layer 614Y and the red light conversion region 630R. The green sub-pixel 640G includes a portion of the yellow emission layer 614Y and the green light conversion region 630G. The yellow sub-pixel 640Y includes a portion of the yellow emission layer 614Y and the yellow light transmission region 630Y.

The total area of the blue sub-pixel 640B corresponds to the sum of the area (L1*W1) and the area (L4*W1). The red sub-pixel 640R, the green sub-pixel 640G, and the yellow sub-pixel 640Y each has the fifth length L5, the fourth width W4, and the area (L5\*W4).

In the sixth exemplary embodiment of the present invention, the unit pixel 640 includes the yellow sub-pixel 640Y to improve efficiency. The area of the blue sub-pixel 640B is increased to improve the color temperature, as described in the fourth and fifth exemplary embodiments of the present invention.

An OLED display, according to exemplary embodiments of the present invention, includes an organic emission layer that includes a blue emission layer and a yellow emission layer. The OLED display includes a filter that includes a blue light transmission region, a red light conversion region, and a green light conversion region, to reduce the number of organic emission layers per unit pixel, while maintaining a minimum margin between neighboring sub-pixels of the organic emission layers, to thereby achieve a high resolution.

The OLED display includes a organic emission unit of a unit pixel, which is partitioned into two parts, and a filter that produces at least three, red, green, and blue light, and thus, a high resolution can be obtained.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. An organic light-emitting diode (OLED) display comprising:
   a first substrate and an opposing second substrate;
   an organic light-emitting unit on a first surface of the first substrate that faces the second substrate, the organic light-emitting unit comprising
      an anode,
      a cathode, and
      an organic emission layer between the anode and the cathode, comprising a blue emission layer to generate blue light and a yellow emission layer to generate yellow light, the yellow and the blue emission layers not overlapping;
   a driving circuit on the first surface of the first substrate, and connected to the organic light-emitting unit; and
   a filter on the second substrate corresponding to the yellow emission layer, to convert the yellow light into red light and green light.

2. The OLED display of claim 1, wherein the filter comprises:
   a blue light transmission region to transmit the blue light;
   a red light conversion region to convert a yellow light from a first portion of the yellow emission layer into the red light; and
   a green light conversion region to convert a yellow light from a second portion of the yellow emission layer into the green light.

3. The OLED display of claim 2, wherein the blue emission layer and the yellow emission layer each has
   a first length in a data line direction,
   a first width in a scan line direction that is perpendicular to the data line direction, and a same area.

4. The OLED display of claim 3, wherein:
   the blue light transmission region has the first length and the first width; and
   the red light conversion region and the green light conversion region each has the first length and a second width that is about half of the first width.

5. The OLED display of claim 4, wherein the OLED display comprises:
   a blue sub-pixel comprising the blue emission layer and the blue light transmission region;
   a red sub-pixel comprising the first portion of the yellow emission layer and the red light conversion region; and
   a green sub-pixel comprising the second portion of the yellow emission layer and the green light conversion region.

6. The OLED display of claim 5, wherein:
   the blue sub-pixel has the first length and the first width; and
   the red sub-pixel and the green sub-pixel each has the first length and the second width.

7. The OLED display of claim 2, wherein:
   the yellow emission layer has a first length in a data line direction and a first width in a scan line direction that is perpendicular to the data line direction;
   the blue emission layer has the first length and a second width that is about half of the first width; and
   the area of the blue emission layer is about half of the area of the yellow emission layer.

8. The OLED display of claim 7, wherein the blue light transmission region, the first red light conversion region, and the green light conversion region each has the first length and the second width.

9. The OLED display of claim 8, wherein the OLED display comprises:
   a blue sub-pixel comprising the blue emission layer and the blue light transmission region;
   a red sub-pixel comprising a portion of the yellow emission layer and the first red light conversion region; and
   a green sub-pixel comprising a portion of the yellow emission layer and the green light conversion region.

10. The OLED display of claim 9, wherein the blue sub-pixel, the red sub-pixel, and the green sub-pixel each has the first length and the second width.

11. The OLED display of claim 2, wherein:
    the blue emission layer has a first length in a data line direction;
    the yellow emission layer has a first width in a scan line direction that is perpendicular to the data line direction;
    the blue emission layer has a second width that is about half of the first width; and
    the yellow emission layer has a second length that is shorter than the first length.

12. The OLED display of claim 11, wherein:
    the blue light transmission layer has the first length and the second width; and
    the first red light conversion region and the green light conversion region each has the second length and the first width.

13. The OLED display of claim 12, wherein the OLED display comprises:
    a blue sub-pixel comprising the blue emission layer and the blue light transmission region;
    a red sub-pixel comprising a portion of the yellow emission layer and the first red light conversion region; and
    a green sub-pixel comprising a portion of the yellow emission layer and the green light conversion region.

14. The OLED of claim 13, wherein:
    the blue sub-pixel has the first length and the second width; and
    the red sub-pixel and the green sub-pixel each has the second length and the second width.

15. The OLED of claim 2, wherein the filter further comprises a yellow light transmission region to transmit a portion of the yellow light.

16. The OLED display of claim 15, wherein:
the blue emission layer and the yellow emission layer each has a first length in a data line direction and a first width in a scan line direction that is perpendicular to the data line direction; and
the blue emission layer and the yellow emission layer each has the same area.

17. The OLED display of claim 16, wherein:
the blue light transmission region has the first length and the first width;
the first red light conversion region has the first length and the second width; and
the green light conversion region and the yellow light transmission region each has the first length and a third width that is about half of the second width.

18. The OLED of claim 17, wherein the OLED display comprises:
a blue sub-pixel comprising the blue emission layer and the blue light transmission region;
a red sub-pixel comprising a portion of the yellow emission layer and the first red light conversion region;
a green sub-pixel comprising a portion of the yellow emission layer and the green light conversion region; and
a yellow sub-pixel comprising a portion of the yellow emission layer and the yellow light transmission region.

19. The OLED of claim 18, wherein:
the blue sub-pixel has the first length and the first width;
the red sub-pixel has the first length and the second width; and
the green sub-pixel and the yellow sub-pixel each has the first length and a third width that is about half of the second width.

20. The OLED of claim 2, wherein the filter further comprises:
a yellow light transmission layer to transmit a portion of the yellow light; and
a second red light conversion region to convert a portion of the yellow light into red right.

21. The OLED of claim 20, wherein:
the yellow emission layer has a first length in a data line direction and a first width in a scan line direction that is perpendicular to the data line direction;
the blue emission layer has the first length and a second width that is about half of the first width; and
the area of the blue emission layer is about half of the area of the yellow emission layer.

22. The OLED of claim 21, wherein:
the blue light transmission region has the first length and the second width;
the first and second red light conversion regions are disposed in a first diagonal direction and each has a third length that is about half of the first length; and
the green light conversion region and the yellow light transmission region are disposed in a second diagonal direction that is perpendicular to the first diagonal direction and each has the third length and the second width.

23. The OLED display of claim 22, wherein the OLED display comprises:
a blue sub-pixel comprising the blue emission layer and the blue light transmission region;
a first red sub-pixel comprising a portion of the yellow emission layer and the first red light conversion region;
a second red sub-pixel comprising a portion of the yellow emission layer and the second red light conversion region; and
a green sub-pixel comprising a portion of the yellow emission layer and the green light conversion region.

24. The OLED of claim 22, wherein:
the blue sub-pixel has the first length and the second width; and
the first and second red sub-pixels, the green sub-pixel, and the yellow sub-pixel each has the third length and the second width.

25. The OLED of claim 2, wherein:
the filter further comprises a yellow light transmission region to transmit a portion of the yellow light;
the blue emission layer comprises,
a first region having a first length in a data line direction and a first width in a scan line direction that is perpendicular to the data line direction, and
a second region having a fourth length that is shorter than the first length; and
the yellow emission layer has a fifth length that is equal to the difference between the first length and the fourth length.

26. The OLED of claim 25, wherein:
the blue light transmission region comprises,
a first region having the first length and the first width, and
a second region having the fourth length and the first width; and
the red light conversion region, the green light conversion region, and the yellow light transmission region each has the fifth length and a fourth width that is about a third of the first width.

27. The OLED of claim 26, wherein the OLED display comprises:
a blue sub-pixel comprising the blue emission layer and the blue light transmission region;
a red sub-pixel comprising a portion of the yellow emission layer and the first red light conversion region;
a green sub-pixel comprising a portion of the yellow emission layer and the green light conversion region; and
a yellow sub-pixel comprising a portion of the yellow emission layer and the yellow light transmission region.

28. The OLED of claim 27, wherein:
the blue sub-pixel comprises,
a first region having the first length and the first width, and
a second region having the fourth length and the first width; and
the red sub-pixel, the green sub-pixel, and the yellow sub-pixel each has the fifth length and the fourth width.

* * * * *